(12) United States Patent
Yao et al.

(10) Patent No.: US 9,214,347 B2
(45) Date of Patent: Dec. 15, 2015

(54) OVERLAY MARK ASSISTANT FEATURE

(71) Applicant: Taiwan Semiconductor Manufacturing Company Ltd., Hsin-Chu (TW)

(72) Inventors: Hsin-Chieh Yao, Hsinchu (TW); Hsien-Cheng Wang, Hsinchu (TW); Huang Chien Kai, Zhubei (TW); Chun-Kuang Chen, Hsin-Chu Hsien (TW)

(73) Assignee: Taiwan semiconductor Manufacturing Company, Ltd., Hsin-Chu (TW)

( * ) Notice: Subject to any disclaimer, the term of this patent is extended or adjusted under 35 U.S.C. 154(b) by 175 days.

(21) Appl. No.: 13/969,005

(22) Filed: Aug. 16, 2013

(65) Prior Publication Data

US 2013/0330904 A1    Dec. 12, 2013

Related U.S. Application Data

(62) Division of application No. 12/784,581, filed on May 21, 2010, now Pat. No. 8,513,821.

(51) Int. Cl.
*H01L 21/28* (2006.01)
*G03F 7/20* (2006.01)
*H01L 23/544* (2006.01)

(52) U.S. Cl.
CPC ............ *H01L 21/28* (2013.01); *G03F 7/70633* (2013.01); *G03F 7/70683* (2013.01); *H01L 23/544* (2013.01); *H01L 2223/54426* (2013.01); *H01L 2223/54453* (2013.01); *H01L 2924/0002* (2013.01)

(58) Field of Classification Search
CPC .................. H01L 21/28; H01L 23/544; H01L 2223/54426
See application file for complete search history.

(56) References Cited

U.S. PATENT DOCUMENTS

| | | | |
|---|---|---|---|
| 6,936,931 B2* | 8/2005 | Baek et al. ..................... | 257/797 |
| 7,598,155 B1 | 10/2009 | Chen et al. | |
| 2003/0032256 A1 | 2/2003 | Lee et al. | |
| 2007/0194466 A1 | 8/2007 | Yamaguchi | |
| 2007/0258637 A1 | 11/2007 | Yang et al. | |
| 2009/0023266 A1* | 1/2009 | Hatano ........................ | 438/401 |
| 2009/0134531 A1* | 5/2009 | Yang ............................. | 257/797 |
| 2009/0206411 A1* | 8/2009 | Koketsu et al. ................ | 257/368 |
| 2009/0291513 A1 | 11/2009 | Ghinovker et al. | |
| 2009/0294995 A1 | 12/2009 | Chen et al. | |
| 2011/0285036 A1 | 11/2011 | Yao et al. | |

FOREIGN PATENT DOCUMENTS

CN         1783494         6/2006

OTHER PUBLICATIONS

Chinese Patent Office, Office Action dated Oct. 31, 2012, Application No. 201010624051.3; 6 pages.

* cited by examiner

*Primary Examiner* — Peniel M Gumedzoe
(74) *Attorney, Agent, or Firm* — Haynes and Boone, LLP

(57) ABSTRACT

A method and apparatus for alignment are disclosed. An exemplary apparatus includes a substrate having an alignment region; an alignment feature in the alignment region of the substrate; and a dummy feature disposed within the alignment feature. A dimension of the dummy feature is less than a resolution of an alignment mark detector.

20 Claims, 9 Drawing Sheets

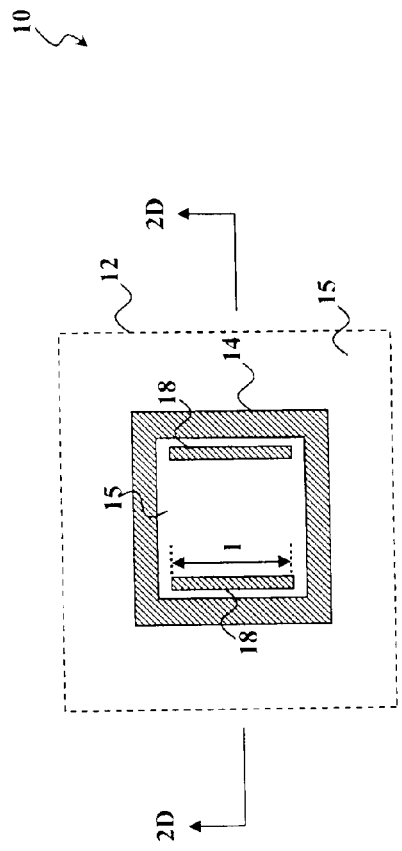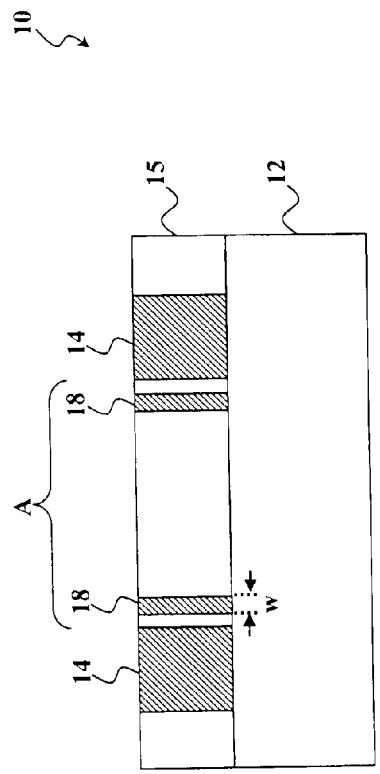
FIG. 2C
FIG. 2D

OVERLAY MARK ASSISTANT FEATURE

PRIORITY DATA

The present application is a divisional application of U.S. patent application Ser. No. 12/784,581, filed May 21, 2010, which is incorporated herein by reference in its entirety.

TECHNICAL FIELD

The present disclosure relates generally to integrated circuit devices, and more particularly, to alignment design structures and methods for manufacturing integrated circuit devices.

BACKGROUND

The semiconductor integrated circuit (IC) industry has experienced rapid growth. Technological advances in IC materials and design have produced generations of ICs where each generation has smaller feature sizes and more complex circuits than those from the previous generation. Such IC devices are fabricated by patterning a sequence of patterned and un-patterned layers, and the features on successive patterned layers are spatially related to each other. During fabrication, each patterned layer must be aligned with the previous patterned layers with a degree of precision. Pattern alignment techniques typically provide an overlay mark to achieve alignment of successive layers. An exemplary overlay mark is a pattern forming an outer (open-centered) box used in a box-in-box (BIB) alignment technique. The outer box may sometimes include a larger than desirable open center (region), which can result in dishing and loading effects during subsequent processing, such as from a chemical mechanical polishing (CMP) process. Although existing alignment structures and methods have been generally adequate for their intended purposes, they have not been entirely satisfactory in all respects.

SUMMARY

The present disclosure provides for many different embodiments. According to one of the broader forms of an embodiment of the present invention, an integrated circuit device includes: a semiconductor substrate having an alignment region; an alignment feature in the alignment region of the substrate; and a dummy feature disposed within the alignment feature. A dimension of the dummy feature is less than a resolution of an alignment mark detector. The substrate can further include a device region, and a device feature can be included in the device region.

In another one of the broader forms of an embodiment of the present invention, an apparatus includes: a semiconductor substrate and a plurality of gate stacks disposed over the semiconductor substrate. The plurality of gate stacks are configured as an alignment mark having an open region. The apparatus further comprises a sub-resolution feature disposed over the semiconductor substrate within the open region of the alignment mark.

Yet another one of the broader forms of an embodiment of the present invention involves a method. The method includes: providing a substrate having an alignment region; forming an alignment feature in the alignment region of the substrate; and forming a dummy feature in the alignment region of the substrate, such that the dummy feature is formed within the alignment feature. A dimension of the dummy feature is less than a resolution of an alignment mark detector.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2C is a top diagrammatic view of a portion of the pattern recognition feature taken along line 2C-2C in FIG. 2B.

FIG. 2D is a diagrammatic sectional side view of the portion of the pattern recognition feature taken along line 2D-2D in FIG. 2C.

DETAILED DESCRIPTION

Figure 1A:
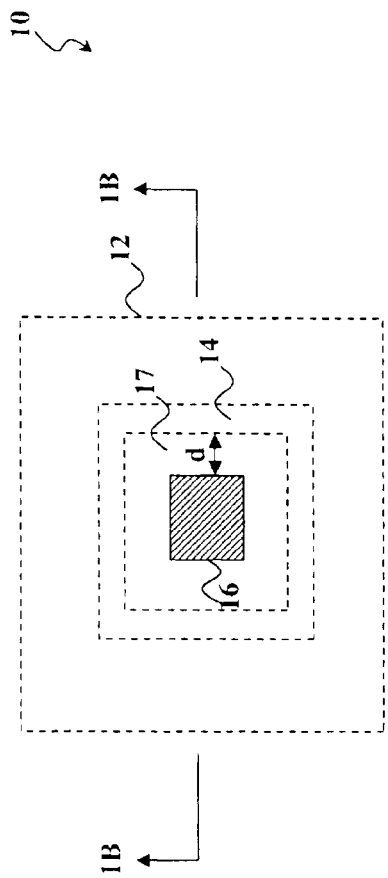
FIG. 1A is a top diagrammatic view of a pattern recognition feature in an integrated circuit (IC) alignment region according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1B:
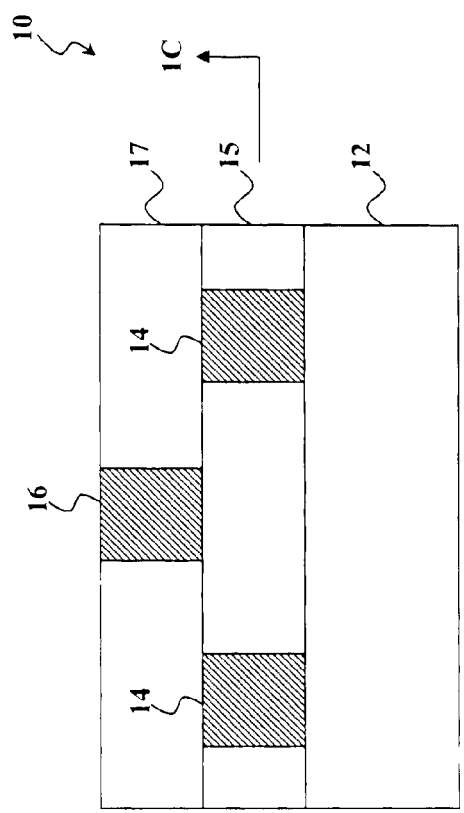
FIG. 1B is a diagrammatic sectional side view of the pattern recognition feature taken along line 1B-1B in FIG. 1A.
Figure 1C:
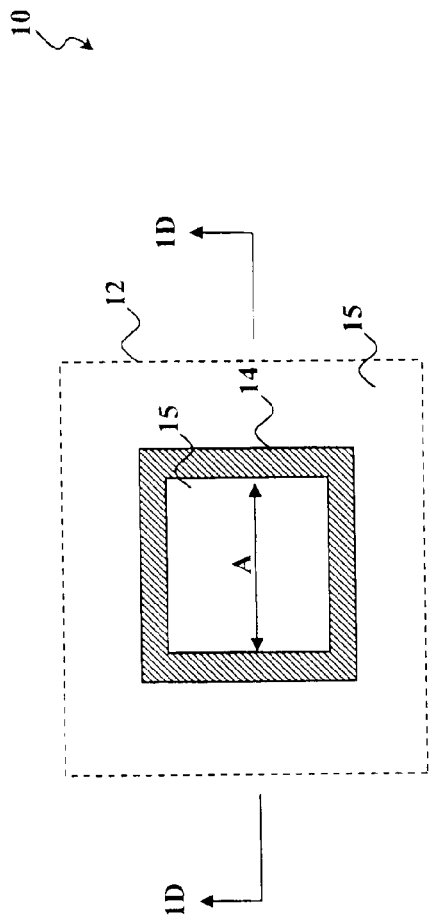
FIG. 1C is a top diagrammatic view of a portion of the pattern recognition feature taken along line 1C-1C in FIG. 1B.
Figure 1D:
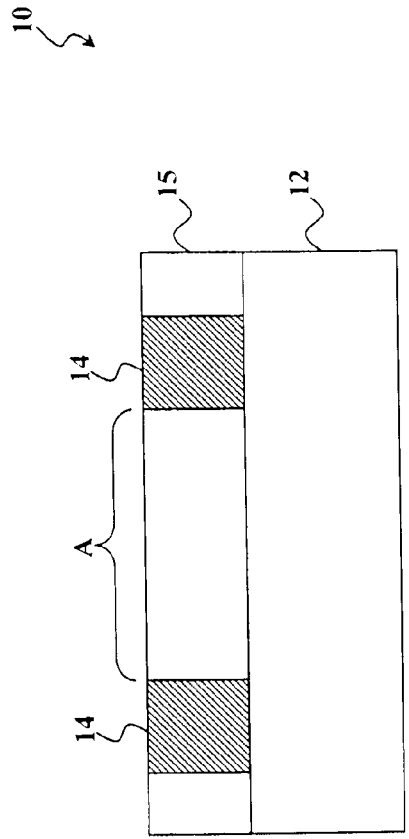
FIG. 1D is a diagrammatic sectional side view of the portion of the pattern recognition feature taken along line 1D-1D in FIG. 1C.

Referring to FIGS. 1A-1D, an embodiment of a pattern recognition technique for aligning successive patterned layers of an integrated circuit device is illustrated. FIG. 1A is a top diagrammatic view of a pattern recognition feature 10 in an integrated circuit (IC) alignment region; FIG. 1B is a diagrammatic sectional side view of the pattern recognition feature 10 taken along line 1B-1B in FIG. 1A; FIG. 1C is a top diagrammatic view of a portion of the pattern recognition feature 10 taken along line 1C-1C in FIG. 1B; and FIG. 1D is a diagrammatic sectional side view of the portion of the pattern recognition feature 10 taken along line 1D-1D in FIG. 1C. FIGS. 1A-1D have been simplified for the sake of clarity to better understand the inventive concepts of the present disclosure. Additional features can be added in the pattern recognition feature 10, and some of the features described below can be replaced or eliminated for additional embodiments of the pattern recognition feature 10.

In the depicted embodiment, the pattern recognition technique is a box-in-box ("BIB") pattern recognition technique, where a pair of concentric alignment features are formed on successive layers of an integrated circuit device. Referring to FIGS. 1A and 1B, the pattern recognition feature 10 is formed on a substrate (or wafer) 12. The substrate 12 is a semiconductor substrate, such as a silicon substrate. Alternatively, the substrate 12 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 12 is a semiconductor on insulator (SOI). In other alternatives, semiconductor substrate 12 may include a doped epi layer, a gradient semiconductor layer, and/or a semiconductor layer overlying another semiconductor layer of a different type, such as a silicon layer on a silicon germanium layer.

The BIB pattern recognition technique utilizes an overlay target 14, represented by an outer (open-centered) box, formed in a material layer 15, and an inner box 16 formed in another material layer 17. The outer box 14 has a first range of dimensions, and the inner box 16 has a second range of dimensions, such that there is a distance d between the boxes 14 and 16. Alternatively, the pattern recognition feature 10 may be designed to include shapes other than boxes, including triangles, rectangles, circles, T-shapes, L-shapes, pluses, crosses, octagons, other suitable shapes, or combinations thereof. Further, the pattern recognition technique may utilize other overlay target designs, such as frame-in-frame, segmented-frame, advanced imaging metrology (AIM), and short vernier (SVNR).

The BIB pattern recognition technique aligns the inner box 16 with the outer box (overlay target) 14. For the sake of example, the outer box 14 is formed in a lower (previous) patterned layer (material layer 15) and the inner box 16 is formed in an upper (next) patterned layer (material layer 17). One or more layers (not shown) can be included between the material layer 15 containing the outer box 14 and the material layer 17 containing the inner box 16 and/or the substrate 12. The outer box 14 may comprise a same or different material than the inner box 16. In the depicted embodiment, the outer box 14 and inner box 16 comprise polysilicon. The outer box 14 may be formed by polysilicon gate lines formed in a polysilicon gate (POLY) layer of the integrated circuit device. Alternatively, the boxes 14 and 16 could include a dielectric layer, such as silicon oxide, silicon oxynitride, silicon nitride, a high-k dielectric material layer, other suitable dielectric materials, or combinations thereof. Exemplary high-k dielectric materials include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium dioxide-alumina ($HfO_2$—$Al_2O_3$) alloy, other suitable high-k dielectric materials, and/or combinations thereof. Boxes 14 and 16 could also include a conductive layer, such as TiN, TaN, Ta, TiAl, TiAlN, TaCN, Al, Cu, W, metal alloys, metal silicide, other suitable materials, and/or combinations thereof. Alternatively, the boxes 14 and 16 could comprise a photoresist material. Contrast enhancing materials may be added to the box materials. The contrast enhancing materials may include a variety of materials, such as one or more dyes, and/or other materials. The dyes may include one or more organic and/or inorganic materials. It is contemplated that the one or more contrast enhancing materials may be absorptive and/or reflective. Further, the boxes 14 and 16 could include a multilayer structure having multiple materials, such as those described herein.

The material layer 15 can comprise a same or different material than the material layer 17. In the depicted embodiment, the material layers 15 and 17 comprise a spin-on-glass (SOG) material. Alternatively, the material layers 15 and 17 comprise a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, and/or combinations thereof. Exemplary low-k dielectric material includes fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The material layers 15 and 17 could comprise yet another suitable material. The material layers 15 and 17 can include a multilayer structure having multiple dielectric materials.

Referring to FIGS. 1C and 1D, a region A (an open region comprising the material layer 15, the SOG material) is located within the outer box (overlay target) 14 of the pattern recognition feature 10. Loading and dishing effects have been observed in region A. For example, these effects have been observed when a chemical mechanical polishing (CMP) process is utilized to planarize a surface of the patterned material layer 15. To avoid damaging the overlay target 14, a CMP process window for the CMP process is also smaller than desirable. Accordingly, as will be described in detail below, the present disclosure implements assistant features within region A (the open region of the overlay target 14) to address such issues while maintaining good pattern contrast and alignment signal detection.

Figure 2A:
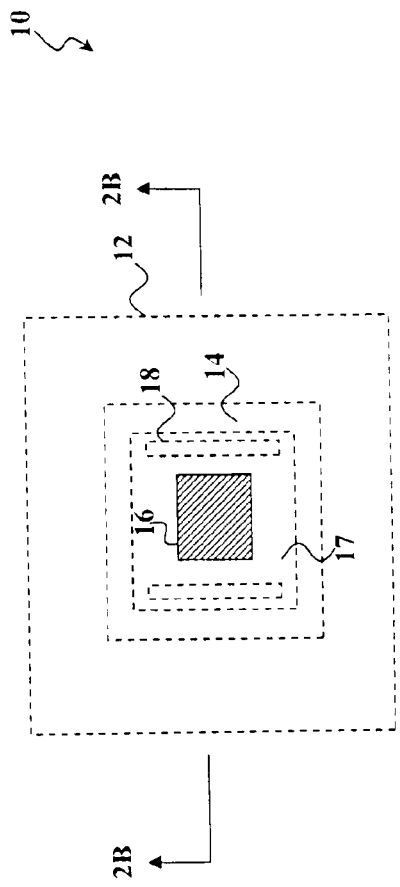
FIG. 2A is a top diagrammatic view of another embodiment of a pattern recognition feature in an integrated circuit (IC) alignment region according to various aspects of the present disclosure.
Figure 2B:
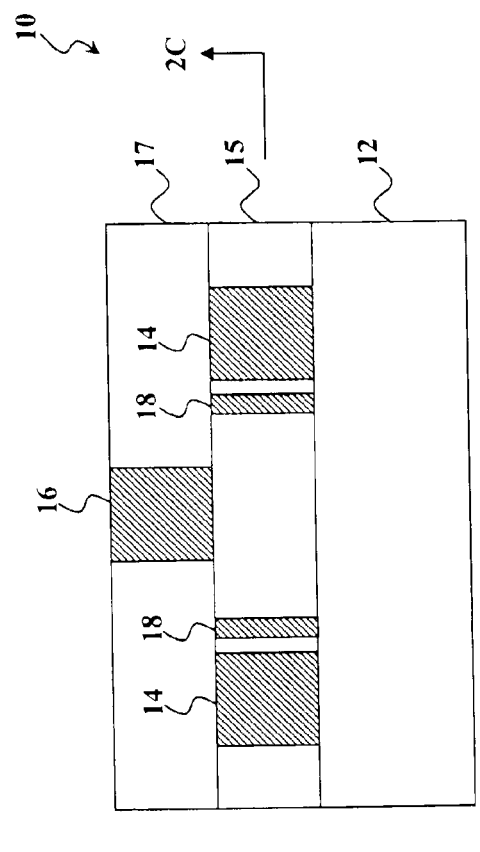
FIG. 2B is a diagrammatic sectional side view of the pattern recognition feature taken along line 2B-2B in FIG. 2A.

Referring to FIGS. 2A-2D, a pattern recognition feature for aligning successive patterned layers of an integrated circuit device is illustrated that is an alternative embodiment to the pattern recognition feature 10 of FIGS. 1A-1D. FIG. 2A is a top diagrammatic view of the alternative embodiment of the pattern recognition feature 10 in the integrated circuit (IC) alignment region; FIG. 2B is a diagrammatic sectional side view of the pattern recognition feature 10 taken along line 2B-2B in FIG. 2A; FIG. 2C is a top diagrammatic view of a portion of the pattern recognition feature 10 taken along line 2C-2C in FIG. 2B; and FIG. 2D is a diagrammatic sectional side view of the portion of the pattern recognition feature 10 taken along line 2D-2D in FIG. 2C. FIGS. 2A-2D have been simplified for the sake of clarity to better understand the inventive concepts of the present disclosure. The embodiment of FIGS. 2A-2D is similar in many respects to the embodiment of FIGS. 1A-1D. Accordingly, similar features in FIGS. 1A-1D and 2A-2D are identified by the same reference numerals for the sake of clarity and simplicity. Additional features can be added in the pattern recognition feature 10, and some of the features described below can be replaced or eliminated for additional embodiments of the pattern recognition feature 10.

The alternative embodiment implements additional features 18 in the material layer 15 in region A (an open area) of the overlay target 14, represented by an outer (open-centered) box. In the depicted embodiment, the additional features 18 are surrounded (or encircled) by the overlay target 14. The additional features 18 may comprise a same or different material than the overlay target 14. For ease of discussion, in the depicted embodiment, the additional features 18 comprise polysilicon, similar to the overlay target 14. The additional features 18 are thus also referred to as dummy poly assistant features, which are inside the outer box 14. In the depicted embodiment, the features 18 have rectangular cross-sections. The illustrated cross-sections are not intended to be limiting, and it is understood that any appropriately shaped feature is contemplated by the present disclosure, such as a square, circle, triangle, cross, L, T, other suitable shape, or combinations thereof.

As shown in FIGS. 2C and 2D, the additional feature 18 includes at least one feature that extends vertically within the overlay target 14, with a length (l) that is measured in the Y-direction (or Y-axis) (FIG. 2C), and a width (w) that is measured in the X-direction (or X-axis) that is approximately perpendicular to the Y-direction (FIG. 2D). The width of the feature 18 is selected such that it is smaller than a resolution of an alignment detection system, such as an overlay measurement system. The alignment detection system can be a part of a lithography system used in fabricating an integrated circuit device. Having the sub-resolution assistant features 18 ensures that the assistant features 18 are not recognized by the alignment detection system, thereby maintaining pattern contrast and good measurement signals. For example, in the depicted embodiment, the resolution of an overlay measurement system may be approximately 0.35 μm. Accordingly, the width of the features 18 is less than about 350 nm. In an example, the width of the features 18 is less than about 100 nm and greater than about 36 nm. Alternatively, a dimension other than width is selected as smaller than the resolution of the alignment detection system.

The additional features 18 can reduce (and sometimes eliminate) the loading and dishing effects arising during polishing processes, such as CMP processes. Because the additional features 18 are included within the overlay target (outer box) 14, increased uniformity in the pattern recognition feature 10 environment can be achieved, further providing increased CMP uniformity and a larger CMP process window. The additional features 18 can be easily implemented into conventional processing, providing a cost-effective and time-conscious solution to loading and dishing effects that may arise during processing of an integrated circuit device, particularly in the IC alignment regions.

Figure 3A:
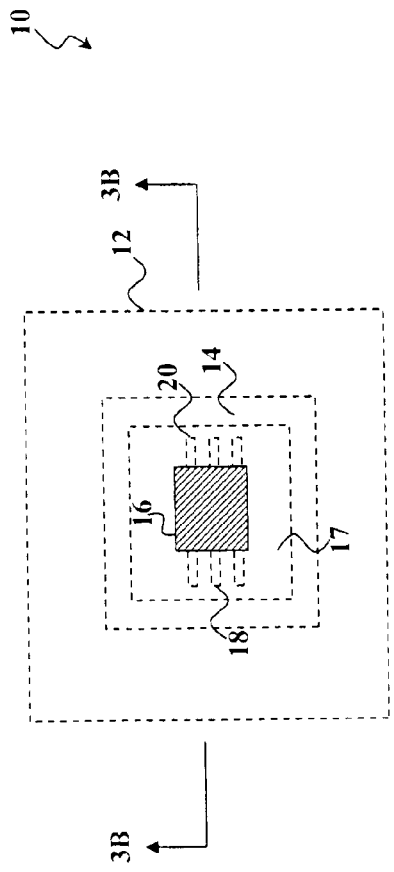
FIG. 3A is a top diagrammatic view of yet another embodiment of a pattern recognition feature in an integrated circuit (IC) alignment region according to various aspects of the present disclosure.
Figure 3B:
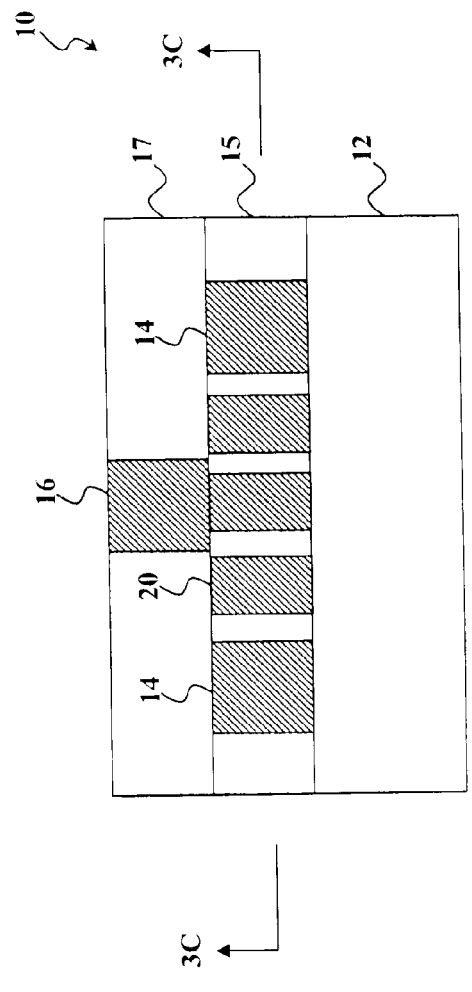
FIG. 3B is a diagrammatic sectional side view of the pattern recognition feature taken along line 3B-3B in FIG. 3A.
Figure 3C:
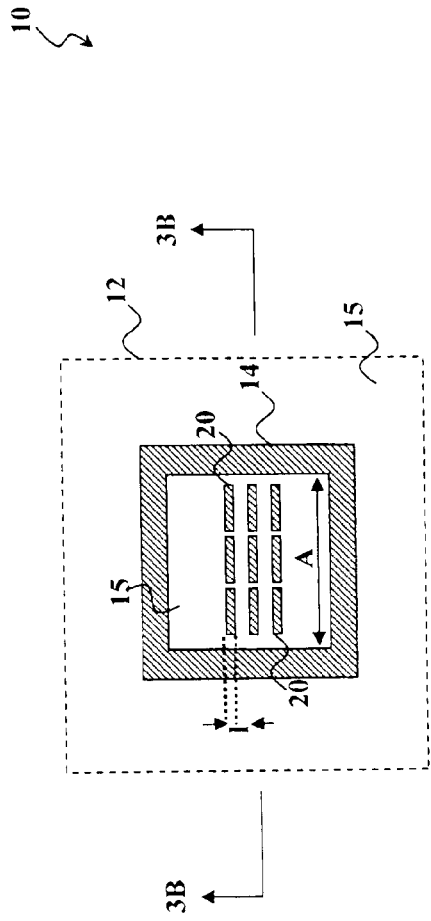
FIG. 3C is a top diagrammatic view of a portion of the pattern recognition feature taken along line 3C-3C in FIG. 3B.
Figure 3D:
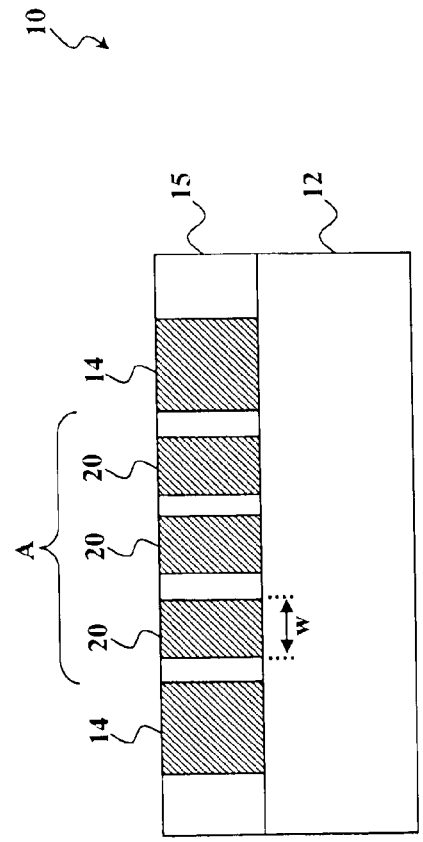
FIG. 3D is a diagrammatic sectional side view of the portion of the pattern recognition feature taken along line 3D-3D in FIG. 3C.

Referring to FIGS. 3A-3D, a pattern recognition feature for aligning successive patterned layers of an integrated circuit device is illustrated that is another alternative embodiment to the pattern recognition feature 10 of FIGS. 1A-1D. FIG. 3A is a top diagrammatic view of the alternative embodiment of the pattern recognition feature 10 in the integrated circuit (IC) alignment region; FIG. 3B is a diagrammatic sectional side view of the pattern recognition feature 10 taken along line 3B-3B in FIG. 3A; FIG. 3C is a top diagrammatic view of a portion of the pattern recognition feature 10 taken along line 3C-3C in FIG. 3B; and FIG. 3D is a diagrammatic sectional side view of the portion of the pattern recognition feature 10 taken along line 3D-3D in FIG. 3C. FIGS. 3A-3D have been simplified for the sake of clarity to better understand the inventive concepts of the present disclosure. The embodiment of FIGS. 3A-3D is similar in many respects to the embodiment of FIGS. 1A-1D. Accordingly, similar features in FIGS. 1A-1D and 3A-3D are identified by the same reference numerals for the sake of clarity and simplicity. Additional features can be added in the pattern recognition feature 10, and some of the features described below can be replaced or eliminated for additional embodiments of the pattern recognition feature 10.

This alternative embodiment implements additional features 20 in the material layer 15 in region A (the open region) of the overlay target 14, represented by an outer (open-centered) box. The additional features are surrounded (or encircled) by the overlay target 14. The additional features 20 may comprise a same or different material than the overlay target 14. For ease of discussion, in the depicted embodiment, the additional features 20 comprise polysilicon, similar to the overlay target 14. The additional features 20 are thus also referred to as dummy poly assistant features, which are inside the outer box 14. In the depicted embodiment, the features 20 have rectangular cross-sections. The illustrated cross-sections are not intended to be limiting, and it is understood that any appropriately shaped feature is contemplated by the present disclosure, such as a square, circle, triangle, cross, L, T, other suitable shape, or combinations thereof.

As shown in FIGS. 3C and 3D, the additional features 20 include at least one feature that extends horizontally within the overlay target 14, with a length (l) that is measured in the Y-direction (or Y-axis) (FIG. 3C), and a width (w) that is measured in the X-direction (or X-axis) that is approximately perpendicular to the Y-direction (FIG. 3D). Similarly to the embodiment in FIGS. 2A-2D, the width of the feature 20 is selected such that it is smaller than a resolution of an alignment detection system, such as an overlay measurement system. This can ensure that the assistant features 20 are not recognized by the alignment detection system, thereby maintaining pattern contrast and good measurement signals. For example, in the depicted embodiment, the resolution of an overlay measurement system may be approximately 0.35 μm. Accordingly, the width of the features 20 is less than about 350 nm. Alternatively, a dimension other than width is selected as smaller than the resolution of the alignment detection system.

Similarly to the additional features 18 in the embodiment in FIGS. 2A-2D, the additional features 20 can reduce (and sometimes eliminate) the loading and dishing effects arising during polishing processes, such as CMP processes. Because the additional features 20 are included within the overlay target (outer box) 14, increased uniformity in the pattern recognition feature 10 environment can be achieved, further providing increased CMP uniformity and a larger CMP process window. The additional features 20 can be easily implemented into conventional processing, providing a cost-effective and time-conscious solution to loading and dishing effects that may arise during processing of an integrated circuit device, particularly in the IC alignment regions.

Another alternative embodiment of the pattern recognition feature 10 of FIGS. 1A-1D could include a combination of the additional features 18 and 20. So long as the assistant features are smaller than a resolution of an alignment detection system, the additional features implemented in the pattern recognition feature 10 can include various dimensions, pitches, shapes, number of patterns, and areas of patterns. Further, the overlay targets, or alignment marks, may not necessarily include closed loop boundaries, such as the outer boxes described above, where the additional features are formed within the open region defined by the closed loop boundaries. Instead, the overlay target may include an open loop boundary, where the additional features are disposed within the open region, defined by the open loop boundary, of the overlay target. The pattern recognition feature 10 including assistant features can also be formed in various layers, including but not limited to the active layers (OD layers, defining active areas of the integrated circuit region), poly layers (PO layers, defining gate areas of the integrated circuit region), contact layers (CO layers, defining contacts to the OD and POLY areas), N-well implant layers (NW layers), P-well implant layers (PW layers), P+ implant layers (PP layers), N+ layers (NP layers), metal layers (M1, M2, ... MN), transistor threshold adjustment implant layers (VT layers), and/or other suitable layers.

Figure 4:
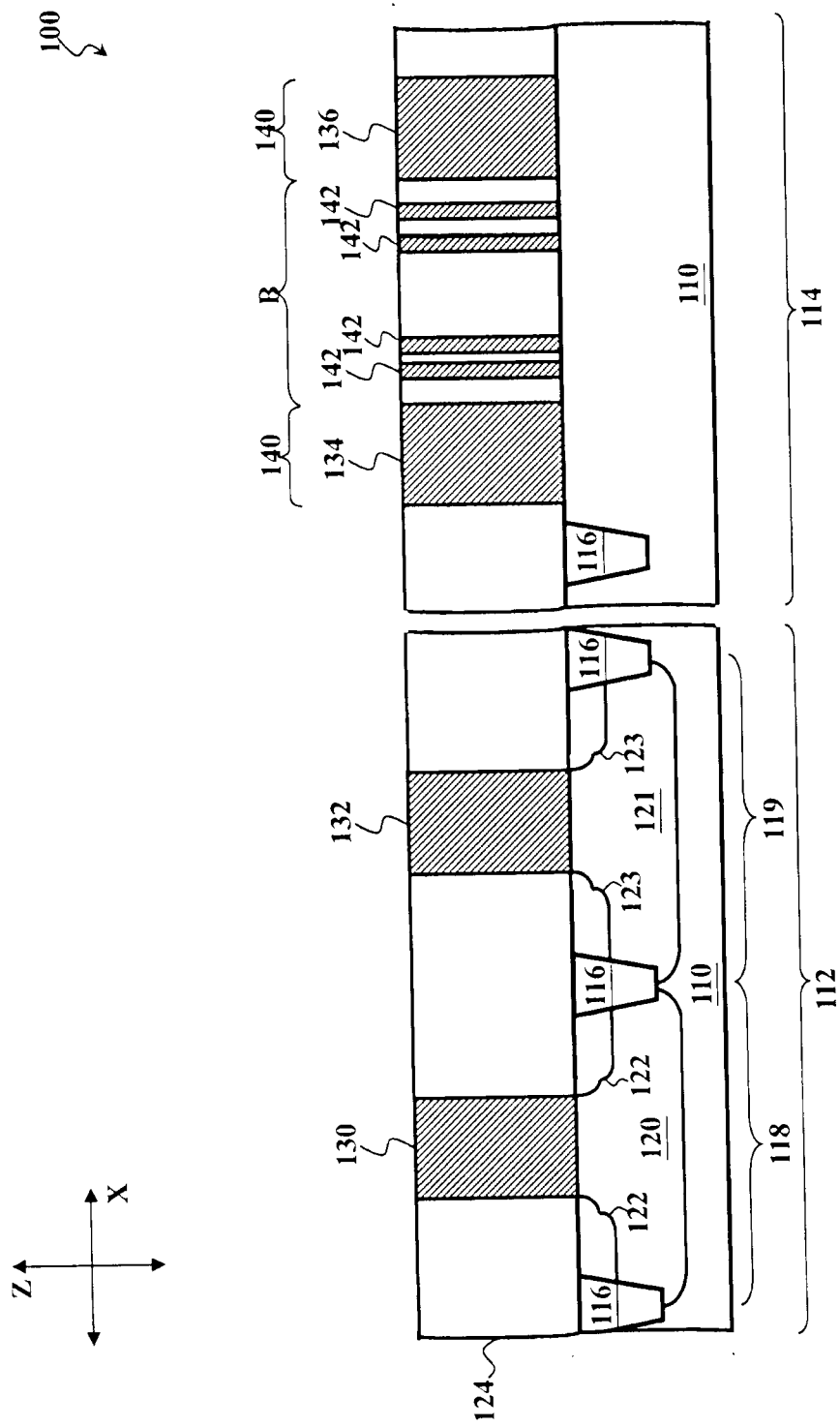
FIG. 4 is a diagrammatic sectional side view of an embodiment of an integrated circuit (IC) device having a pattern recognition feature in an IC alignment region of the IC device according to various aspects of the present disclosure.

FIG. 4 is a diagrammatic sectional side view of an integrated circuit device 100 having a pattern recognition feature. The integrated circuit device 100 includes a substrate 110, such as a silicon substrate. Alternatively, the substrate 110 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 110 is a semiconductor on insulator (SOI). In other alternatives, semiconductor substrate 110 may include a doped epi layer, a gradient semiconductor layer, and/or a semiconductor layer overlying another semiconductor layer of a different type, such as a silicon layer on a silicon germanium layer.

The substrate 110 includes a device region 112 and an alignment region 114. The device region 112 may include a variety of integrated circuit devices, including active components, such as metal-oxide-semiconductor field effect transistors (MOSFETs), complementary metal-oxide-semiconductor transistors (CMOSs), high voltage transistors, and/or high frequency transistors; other suitable components; and/or combinations thereof. The device region 112 may additionally include passive components such as resistors, capacitors, inductors, and/or fuses. The alignment region 114 may include various pattern recognition features, including alignment marks, overlay marks, other suitable alignment features, or combinations thereof. The regions 112 and 114 will be further described below.

Isolation features 116 are formed in the substrate 110 to isolate various regions, such as the device region 112 and the alignment region 114, of the substrate 110. The isolation features 116 also isolate devices within the device region 112 from one another, such as devices 118 and 119. The isolation features 116 utilize isolation technology, such as local oxidation of silicon (LOCOS) and/or shallow trench isolation (STI), to define and electrically isolate the various regions. The isolation features 116 comprise silicon oxide, silicon nitride, silicon oxynitride, other suitable materials, or combinations thereof. The isolation features 116 are formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

In the depicted embodiment, the devices 118 and 119 are field-effect-transistors (FETs). The devices 118 and 119 include doped regions 120 and 121 that may be doped the same or differently. The doped regions 120 and 121 are n-type wells (n-well) or p-type wells (p-well) depending on device configuration. For example, the device 118 may be configured as an n-type FET (NFET), and the device 119 may be configured as a p-type FET (PFET). Accordingly, the doped region 120 is doped with a p-type doping species, and the doped region 121 is doped with an n-type doping species.

The devices 118 and 119 further include source and drain (S/D) regions 122 and 123. The S/D regions 122 and 123 can include lightly doped S/D (LDD) regions, heavily doped S/D (HDD) regions, or a combination thereof. The LDD regions may include halo/pocket implantations, and the HDD regions may include raised S/D regions. The S/D regions are formed in the substrate 110 by ion implantation processes, photolithography processes, diffusion processes, annealing processes (e.g., rapid thermal annealing and/or laser annealing processes), and/or other suitable processes. Raised S/D regions can be formed by an epitaxy process, such as a CVD deposition techniques (e.g., vapor-phase epitaxy (VPE) and/or ultra-high vacuum CVD (UHV-CVD)), molecular beam epitaxy, and/or other suitable processes. The doping species depends on the type of device being fabricated and includes p-type dopants, such as boron or $BF_2$; n-type dopants, such as phosphorus or arsenic; and/or combinations thereof. For example, the device 118 configured as an NFET device may include S/D regions 122 doped with n-type dopants, and the device 119 configured as a PFET device may include S/D regions 123 doped with p-type dopants. Though not depicted, in alternate embodiments, it is contemplated that doped regions and S/D regions may also be formed in the alignment region 214.

An inter-level dielectric (ILD) layer 124 is disposed over the substrate 110 in the device and alignment regions 112 and 114. The ILD layer 124 comprises a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer 124 can include a multilayer structure having multiple dielectric materials.

Gate stacks 130 and 132 are formed in the device region 112, and gate stacks 134 and 136 are formed in the alignment region 114. The number of gate stacks is not limited by the integrated circuit device 100, and can include more or less than that depicted in FIG. 4. In the depicted embodiment, the gate stacks 130, 132, 134, and 136 are simultaneously formed, such that each gate stack 130, 132, 134 and 136 comprises the same materials or layers. Alternatively, the gate stacks 130, 132, 134, 136 may be formed by different processes or materials. The gate stacks comprise one or more material layers, including but not limited to interfacial layers, gate dielectric layers, high-k dielectric layers, capping layers, diffusion/barrier layers, conductive layers, other suitable layers, or combinations thereof.

The gate stacks 130, 132, 134, and 136 are formed by deposition, photolithography patterning, and etching processes. The deposition processes include chemical vapor deposition (CVD), physical vapor deposition (PVD), atomic layer deposition (ALD), high density plasma CVD (HD-PCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, or ion-beam writing. The etching processes include dry etching, wet etching, and/or other etching methods.

In the depicted embodiment, the gate stacks include a gate dielectric layer (not shown) and a gate layer. The gate dielectric layer is formed over the substrate 110 and comprises a dielectric material, such as silicon oxide, silicon oxynitride, silicon nitride, a high-k dielectric material layer, other suitable dielectric materials, and/or combinations thereof. Exemplary high-k dielectric materials include $HfO_2$, HfSiO, HfSiON, HfTaO, HfTiO, HfZrO, other suitable high-k dielectric materials, and/or combinations thereof. The gate dielectric layer may include a multilayer structure. For example, the gate dielectric layer could include an interfacial layer, and a high-k dielectric material layer formed on the interfacial layer.

The gate layer is formed over the gate dielectric layer. In the present embodiment, the gate layer is a polycrystalline silicon (or polysilicon) layer. The polysilicon layer may be doped for proper conductivity. Alternatively, the polysilicon is not necessarily doped if a dummy gate is to be formed and is replaced in a subsequent gate replacement process. Alternatively, the gate layer could include a conductive layer having a proper work function, therefore, the gate layer can also be referred to as a work function layer. The work function layer comprises any suitable material, such that the layer can be tuned to have a proper work function for enhanced performance of the associated device. For example, if a P-type work function metal (P-metal) for a PMOS device is desired, TiN or TaN may be used. On the other hand, if an N-type work function metal (N-metal) for NMOS devices is desired, Ta, TiAl, TiAlN, or TaCN, may be used. The work function layer could include doped conducting oxide materials. The gate layer could include other conductive materials, such as aluminum, copper, tungsten, metal alloys, metal silicide, other suitable materials, and/or combinations thereof. For example, where the gate layer includes a work function layer, another conductive layer can be formed over the work function layer.

Figure 5A:
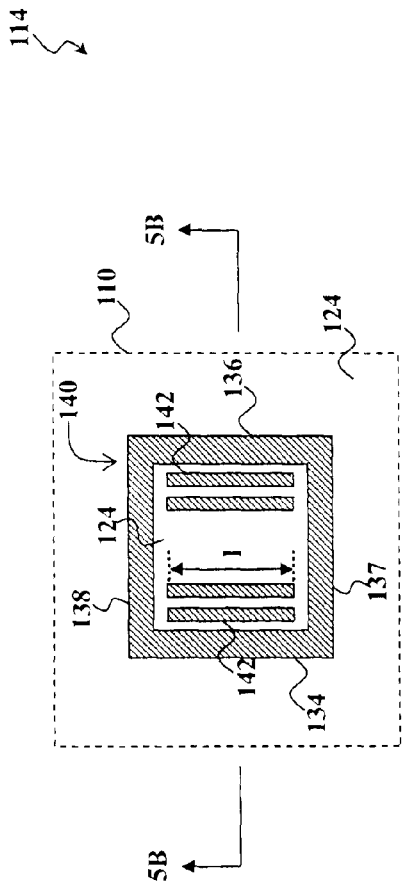
FIG. 5A is a top diagrammatic view of an embodiment of the IC alignment region of the IC device of FIG. 4.
Figure 5B:
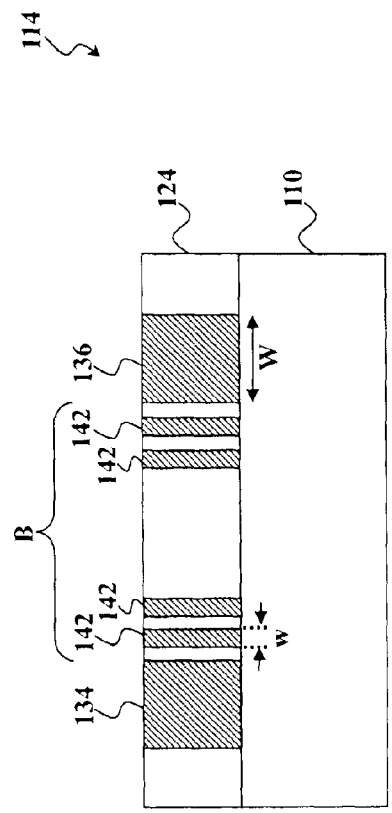
FIG. 5B is a diagrammatic sectional side view of the IC alignment region taken along line 5B-5B in FIG. 5A.

The gate stacks 134 and 136 are configured to form a portion of an alignment mark, such as an overlay target. Referring to FIGS. 5A and 5B, the gate stacks 134 and 136 are configured to form an overlay target for a box-in-box alignment technique. FIG. 5A is a top diagrammatic view of an embodiment of the alignment region 114 of the integrated circuit device 100 of FIG. 4, and FIG. 5B is a diagrammatic sectional side view of the alignment region 114 of the integrated circuit device 100 taken along line 5B-5B in FIG. 5A. In the depicted embodiment, the gate stacks 134 and 136 are disposed in parallel with one another and meet with gate stacks 137 and 138, which are substantially perpendicular to gate stacks 134 and 136, to form the overlay target 140, which is an outer box (open-centered).

Within the outer box (overlay target) 140 is a region B (an open region) that includes assistant features 142. The assistant features 142 are surrounded (or encircled) by the overlay target 140. The assistant features 142 may comprise a same or different material than the overlay target 14. For ease of discussion, in the depicted embodiment, the assistant features 142 comprise polysilicon, similar to the overlay target 140. The assistant features 142 have rectangular cross-sections. Alternatively, the assistant features 142 are designed to exhibit a different cross-section, such as a square, circle, triangle, cross, L, T, other suitable shape, or combinations thereof. The assistant features 142 can be formed simultaneously or independently of the gate stacks 130, 132, 134, 136, or combination thereof. For example, in the depicted embodiment, the assistant features 142 are formed simultaneously with the gate stacks 130, 132, 134, and 136. Accordingly, the assistant features 142 are dummy poly gate stacks.

A width (W) of the gate stacks 134 and 136 is measured in the X-direction. In the depicted embodiment, the width of the gate stacks 134 is about 1 μm, and the width of the B region is about 15 μm. The B region may comprise other widths, for example, the width of the B region may be from about 235 nm to about 23 μm. The assistant features 142 extend vertically within the overlay target 140, with a length (l) that is measured in the Y-direction (or Y-axis) (FIG. 5A), and a width (w) that is measured in the X-direction (or X-axis) that is approximately perpendicular to the Y-direction (FIG. 5B). The width of the assistant features 142 is selected such that it is smaller than a resolution of an alignment detection system, such as an overlay measurement system. The width of the assistant features 142 may also be selected such that it is larger than a minimum value defined by a design rule. Selecting a sub-resolution width ensures that the assistant features 142 are not recognized by the alignment detection system, thereby maintaining pattern contrast and good measurement signals. For example, in the depicted embodiment, the resolution of an overlay measurement system may be approximately 0.35 μm. Accordingly, the width of the assistant features 142 is less than about 350 nm. In an example, the width of the assistant features 142 is less than about 100 nm and greater than about 36 nm. Alternatively, a dimension other than width is selected as smaller than the resolution of the alignment detection system.

The various assistant features 142 can reduce loading and dishing effects caused by subsequent processing, such as subsequent CMP processes to planarize the surface of the ILD layer 124 and/or gate stacks 130, 132, 134, or 136. It is understood that each of the assistant features 142 may exhibit varying dimensions and/or shapes. Further, the assistant features 142 can be located at various locations within region B of the overlay target 140, and can further form various patterns within the region B of the overlay target 140.

Figure 6:
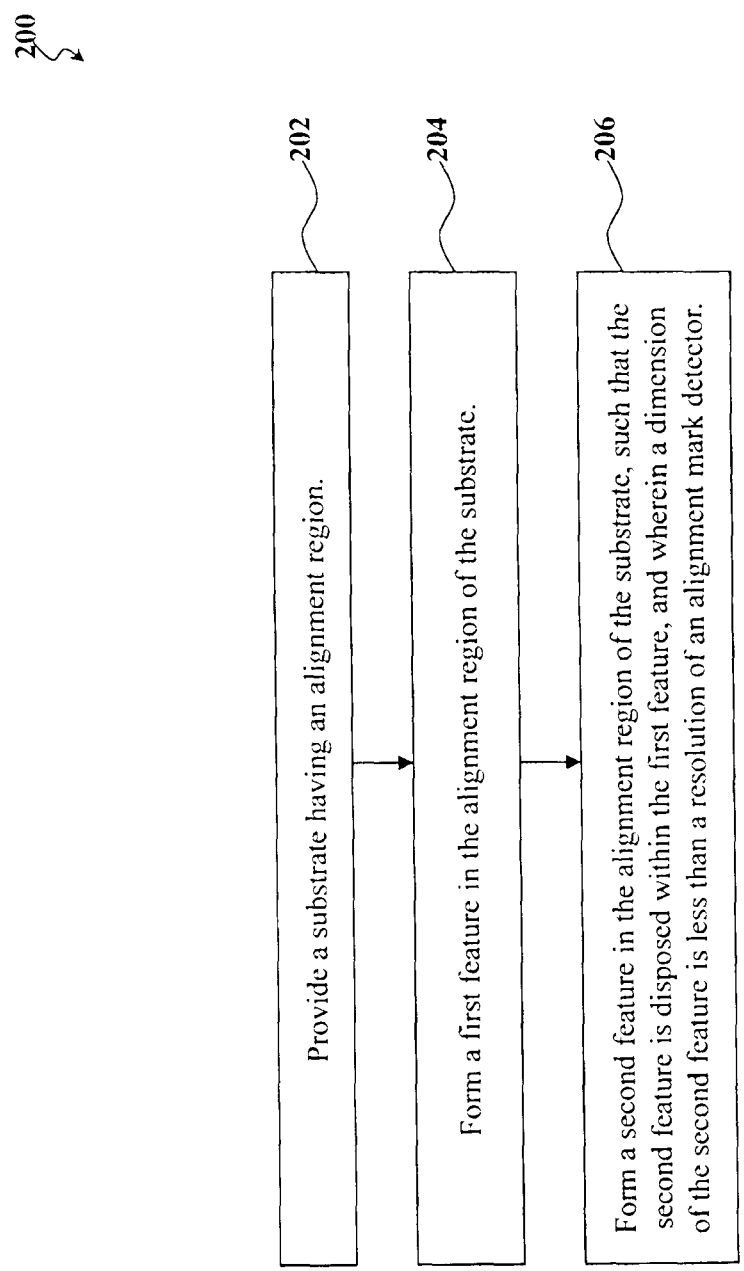
FIG. 6 is a flow chart of a method for fabricating an integrated circuit device according to various aspects of the present disclosure.

FIG. 6 is a flow chart of a method 200 for fabricating an integrated circuit device. The method 200 begins at block 202 where a substrate having a device region and an alignment region is provided. At block 204, a first feature is formed in the alignment region of the substrate. At block 206, a second feature is formed in the alignment region of the substrate, such that the second feature is disposed within the first feature. The second feature comprises a dimension that is less than a resolution of an alignment mark detector. The discussion above illustrates various embodiments of an integrated circuit device, or an alignment region of an integrated circuit device, that can be fabricated according to the method 200 of FIG. 6. For example, in the depicted embodiment, the first feature is similar to the alignment features (overlay targets) described above, and the second feature is similar to the dummy features (assistant/additional features) described above. Additional steps can be provided before, during, and after the method 200, and some of the steps described can be replaced or eliminated for additional embodiments of the method.

The first feature can be used in a pattern recognition method, while the sub-resolution second feature is undetected by the pattern alignment system. In an exemplary pattern recognition method, the outer box is exposed to radiation by a suitable generator known in the art. The radiation includes visible, invisible, fluorescent, and/or polarized (which may include a single mode or multiple mode) radiation. For example, the generator can include an invisible electromagnetic wave generator, which generates a variety of invisible electromagnetic waves, including X-ray, ultraviolet (UV), and/or deep ultraviolet (DUV) waves. It is further contemplated that the radiation may possess a single wavelength or multiple wavelengths. Reflective beams from the outer box are then detected by a detector, which may include a wavelength dispersive spectrometer, an energy dispersive spectrometer, and/or other detectors. When the reflective beams are detected, the location of the outer box may be identified. As a result, an inner box formed in a subsequently formed layer over the substrate may be properly positioned.

Many variations of the above example are contemplated by the present disclosure. For example, as noted above, the disclosed examples have been simplified for the sake of clarity to better understand the inventive concepts of the present disclosure. Any combination of dimensions, pitches, shapes, number of patterns, or area of patterns is contemplated for the sub-resolution assistant feature. In some examples, an assistant feature is divided into multiple assistant features. In some examples, the overlay marks (for example, the outer boxes) are divided into multiple material features to form the overlay marks. Any combination of the examples described herein is contemplated.

In summary, a sub-resolution assistant feature is added within an open region of an overlay mark (or alignment mark), such as an outer box of a box-in-box alignment pattern. The sub-resolution assistant feature can provide increased uniformity, thereby reducing loading and dishing effects caused by polishing processes, such as chemical mechanical polishing (CMP) processes. Because the assistant feature is sub-resolution, satisfactory pattern contrast and alignment detection can be maintained. Different embodiments may have different advantages than those described herein, and no particular advantage is necessarily required of any embodiment.

The foregoing outlines features of several embodiments so that those skilled in the art may better understand the aspects of the present disclosure. Features illustrated and discussed above with respect to some embodiments can be combined with features illustrated and discussed above with respect to other embodiments. Those skilled in the art should appreciate that they may readily use the present disclosure as a basis for designing or modifying other processes and structures for carrying out the same purposes and/or achieving the same advantages of the embodiments introduced herein. Accordingly, all such modifications are intended to be included within the scope of this disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate having an alignment region;
forming first alignment feature in the alignment region of the substrate;
forming a first dummy feature in the alignment region of the substrate, and wherein a dimension of the dummy feature is less than a resolution of an alignment mark detector;
forming a second dummy feature in the alignment region of the substrate and spaced apart from the first dummy feature, wherein a dimension of the second dummy feature is less than the resolution of the alignment mark detector; and
forming a second alignment feature directly over the first and second dummy features feature such that the second alignment feature extends continuously from the first dummy feature to the second dummy feature and overlaps both the first and second dummy features.

2. The method of claim 1 wherein forming the first alignment feature comprises forming an outer box-in-box alignment pattern in a material layer over the substrate.

3. The method of claim 2 wherein forming the first dummy feature includes forming the first dummy feature within an open region of the outer box.

4. A method of claim 1 further comprising performing a chemical mechanical polishing process.

5. The method of claim 1 further comprising forming a semiconductor device in a device region of the substrate.

6. The method of claim 5 wherein forming the first alignment feature, first dummy feature, and semiconductor device comprises:
forming a polysilicon (poly) layer over the substrate;
patterning the poly layer to form a poly gate stack as the alignment feature, a dummy poly gate stack as the first dummy feature, and another poly gate stack as the semiconductor device;
forming an inter-level dielectric (ILD) layer over the substrate; and
performing a chemical mechanical polishing (CMP) process to planarize the ILD layer.

7. The method of claim 5 wherein forming the first alignment feature, dummy feature, and semiconductor device comprises:
forming a material layer over the substrate;
patterning the material layer to have a first opening, a second opening, and a third opening;
filling the first, second, and third openings with gate layer; and
performing a chemical mechanical polishing (CMP) process to planarize the gate layer.

8. A method comprising:
forming a first alignment feature in an alignment region of a substrate;
forming a first dummy feature disposed within the first alignment feature, wherein a dimension of the first dummy feature is less than a resolution of an alignment mask detector;
forming a second dummy feature disposed within the first alignment feature, wherein a dimension of the second dummy feature is less than the resolution of the alignment mask detector; and
forming a second alignment feature directly over the first and second dummy features such that a portion of the second alignment feature overlaps a portion of the first dummy feature and overlaps a portion of the second dummy feature, the second alignment feature extending continuously from the first dummy feature to the second dummy feature.

9. The method of claim 8, wherein the first alignment feature in the alignment region of the substrate includes forming the first alignment feature in a first material layer, and
wherein forming the second alignment feature directly over the first and second dummy features includes forming the second alignment feature in a second material layer, wherein the first and second material layers are formed of different materials.

10. The method of claim 8, wherein forming the first alignment feature in the alignment region of the substrate includes forming the first alignment feature in a first material layer, and
wherein forming the second alignment feature directly over the first and second dummy features includes forming the second alignment feature in a second material layer, wherein the second material layer physically contacts the first material layer.

11. The method of claim 8, wherein the second alignment feature physically contacts top surfaces of the first and second dummy features, respectively.

12. The method of claim 8, further comprising forming a device in a device region of the substrate, wherein the device and the first alignment feature are formed of the same material.

13. The method of claim 12, wherein the device is a transistor.

14. The method of claim 8, wherein the first alignment feature is an overlay mark.

15. A method comprising:
forming a first gate stack in an alignment region of a semiconductor substrate, wherein the first gate stack is configured as a first alignment mark having an open region;
forming a first sub-resolution feature over the semiconductor substrate within the open region of the first alignment mark, wherein a dimension of the first sub-resolution feature is less than a resolution of an alignment mark detector;
forming a second sub-resolution feature over the semiconductor substrate within the open region of the first alignment mark, wherein a dimension of the second sub-resolution feature is less than the resolution of the alignment mark defector; and
forming a second alignment mark directly over the first and second sub-resolution features such that a portion of the second alignment mark overlaps a portion of the first sub-resolution feature and overlaps a portion of the second sub-resolution feature, the second alignment feature extending continuously from the first sub-resolution feature to the second sub-resolution feature.

16. The method of claim 15, wherein the first sub-resolution feature comprises a dummy gate stack.

17. The method of claim 15, wherein the first alignment mark is an overlay mark, and wherein the overlay mark is an outer box of a box-in-box alignment pattern.

18. The method of claim 15, further comprising forming a second gate stack in a device region of the semiconductor substrate, and
wherein the first gate stack, the second gate stack, and the first sub-resolution feature comprise a same material.

19. The method of claim 15, wherein the second alignment mark physically contents tops surfaces of the first and second sub-resolution features, respectively.

20. The method of claim 15, wherein the first and second sub-resolution features are spaced apart from each other by a dielectric material layer.

* * * * *